United States Patent [19]

Yamazaki et al.

[11] Patent Number: 5,609,774

[45] Date of Patent: Mar. 11, 1997

[54] APPARATUS FOR MICROWAVE PROCESSING IN A MAGNETIC FIELD

[75] Inventors: Shunpei Yamazaki, Tokyo; Masaya Kadono, Atsugi; Kenji Itoh, Zama; Toru Takayama; Yasuyuki Arai, both of Atsugi; Noriya Ishida, Asahikawa, all of Japan

[73] Assignee: Semiconductor Energy Laboratory Co., Inc., Kanagawa-ken, Japan

[21] Appl. No.: 194,571

[22] Filed: Feb. 10, 1994

Related U.S. Application Data

[62] Division of Ser. No. 892,710, May 29, 1992, Pat. No. 5,302,226, which is a continuation of Ser. No. 537,300, Jun. 13, 1990.

Foreign Application Priority Data

Jun. 15, 1989 [JP] Japan .................................. 1-152909
Jun. 15, 1989 [JP] Japan .................................. 1-152910

[51] Int. Cl.$^6$ .................................................. H01L 21/302
[52] U.S. Cl. .............................. 216/69; 216/70; 156/345; 156/643.1; 118/723 R
[58] Field of Search .............................. 156/345, 643.1; 118/723 R; 204/298.02, 298.31, 298.38, 298.06, 298.34; 216/69, 70

[56] References Cited

U.S. PATENT DOCUMENTS

| | | | |
|---|---|---|---|
| 4,559,100 | 12/1985 | Ninomiya et al. ...................... | 156/345 |
| 4,705,595 | 11/1987 | Okudaira et al. ...................... | 156/345 |
| 4,738,748 | 4/1988 | Kisa ................................. | 204/298.33 |
| 4,795,529 | 1/1989 | Kawasaki et al. ................. | 204/298.38 |
| 4,808,258 | 2/1989 | Otsubo et al. ...................... | 204/298.34 |
| 4,876,983 | 10/1989 | Fukuda et al. ...................... | 204/298.37 |
| 4,877,509 | 10/1989 | Ogawa et al. ...................... | 204/298.38 |
| 4,926,791 | 5/1990 | Hirose et al. ........................... | 156/345 |
| 4,950,376 | 8/1990 | Hayashi et al. ..................... | 204/298.34 |
| 4,960,073 | 10/1990 | Suzuki et al. ...................... | 204/298.37 |

FOREIGN PATENT DOCUMENTS

| | | |
|---|---|---|
| 0273741 | 7/1988 | European Pat. Off. . |
| 0326405 | 8/1989 | European Pat. Off. . |
| 63-213674 | 4/1988 | Japan . |
| 64064221 | 1/1989 | Japan . |
| 01100263 | 9/1989 | Japan . |
| 02068900 | 3/1990 | Japan . |
| 02112232 | 4/1990 | Japan . |

OTHER PUBLICATIONS

"The American Heritage Dictionary of the English Language"; © 1969, ISBN 395-09066-0, p. 829.
"The Relationship Between Surface Potential and Etching Characteristics With ECR Plasma"; Fujiwara et al.; 1988 Dry Process Symposium; pp. 9–14.

*Primary Examiner*—R. Bruce Breneman
*Assistant Examiner*—George Goudreau
*Attorney, Agent, or Firm*—Sixbey Friedman Leedom & Ferguson; Gerald J. Ferguson, Jr.; Evan R. Smith

[57] ABSTRACT

A microwave-assisted plasma processing apparatus has a reaction chamber in which a substrate holder is provided to support a substrate to be treated. The holder is formed congruent with the inside of reaction chamber and located to substantially separate a reaction space in the reaction chamber save for a narrow clearance therebetween through which exhausted gas passes from said reaction space into said auxiliary space. By this structure, high density plasmas can be formed in the reaction chamber without substantial loss of input microwave energy.

10 Claims, 4 Drawing Sheets

APPARATUS FOR MICROWAVE PROCESSING IN A MAGNETIC FIELD

This is a Divisional application of Ser. No. 07/892,710, filed May 29, 1992 now U.S. Pat. No. 5,302,226, which itself was a continuation of Ser. No. 07/537,300, filed Jun. 13, 1990.

BACKGROUND OF THE INVENTION

1. Field of the Invention

The present invention relates to an microwave processing in a magnetic field such as for use in depositing or etching processes.

2. Description of the Prior Art

One example of known microwave processing apparatuses is an ion shower apparatus as described in Japanese Patent Application No. sho55-141729 (Publication No.sho57-133636) in the name of Seitaroh Matsuo. The apparatus of this type is well known as an ECR (electron cyclotron resonance) apparatus which utilizes divergence of a magnetic field. FIG. 1 is a schematic cross sectional view of this type apparatus. The apparatus comprises a reaction chamber 33 provided with a plasma generating space 19, a coil 17 enclosing the space 19 and a substrate holder 13. The plasma generating space 19 is partially sectioned by means of a partition 31 having a center plasma outputting opening 32. The substrate holder 13 is located apart from the opening 32 by a predetermined distance 30 (20~30 cm) in which lines of magnetic force diverge toward the holder (region 29). When microwaves are inputted to the space 19 from a waveguide 34 through a quartz window 15, a plasma is generated in the space 19 and some of the plasma is drawn to the reaction chamber 33 through the opening 32 by virtue of the diverging magnetic field to shower the substrates 1 on the holder 13 with the plasma.

The pressure of the plasma is limited during the deposition up to 0.003 Torr at which ions have substantially large mean free paths. The microwave energy inputted to the apparatus is also limited up to 0.5 KW. In this prior art structure, however, a substantial portion of inputted microwave energy is lost during the treatment in the form of a plasma flow passing through the reaction chamber 33 and drawn by an evacuation system 10. This is particularly problematic when deposition is desired to coat a relatively large area, e.g. with diamond by chemical vapor deposition. Furthermore, the uniformity of the deposited films were not so high, i.e. the thicknesses of the deposited films at center positions and peripheral positions substantially differed.

The microwave processing has been employed also for plasma etching as proposed by the applicant (Patent Publication for Opposition No.sho63-44827 filed on Oct. 14, 1985). The effect of etching varies dependent upon the position by use of prior art processing apparatuses for the same reason as the thickness disparity described above. Namely, the accuracy of fine patterns becomes worse at peripheral positions and it is impossible to effect anisotropic etching in the direction normal to a substrate.

BRIEF SUMMARY OF THE INVENTION

It is an object of the present invention to provide a plasma processing apparatus capable of producing a high density plasma without substantial loss of input energy.

It is another object of the present invention to provide a plasma processing apparatus capable of carrying out plasma treatment over a large area in a uniform manner.

Additional objects, advantages and novel features of the present invention will be set forth in the description which follows, and in part will become apparent to those skilled in the art upon examination of the following or may be learned by practice of the present invention. The object and advantages of the invention may be realized and attained by means of the instrumentalities and combinations particularly pointed out in the appended claims.

To achieve the foregoing and other object, and in accordance with the present invention, as embodied and broadly described herein, a plasma generation (or reaction) space is substantially confined by an inner wall of a vacuum chamber and a holder supporting a substrate to be treated. The clearance between the chamber and the holder is adjusted to be so small as not to lose input energy in the form of energized reactive gas passing therethrough. Typically, the clearance is selected to be no larger than ¼ of the wavelength of input microwaves, e.g. 30.6 mm/4 corresponding to 2.45 GHz. The reflection of input microwaves can be also reduced by this structure, e.g. no higher than 5% of input energy.

In the case of a cylindrical reaction chamber into which a cylindrical substrate holder is inserted in a coaxial relationship, the thickness of the holder is typically chosen 10 to 50 mm. Alternatively, a cylindrical reaction chamber is provided with a larger chamber in which is disposed a substrate holder located coaxially with the cylindrical chamber and having a larger diameter than that of the cylindrical chamber by no less than ¼ of the wavelength of input microwaves.

By this structure, high density plasmas can be formed at 0.01 to 10 Torr without substantial loss of input microwave energy and the plasma processing can be effected over large areas in a uniform manner. One of the applications of this invention is deposition of diamond films utilizing gaseous carbon compound gas. The carbon compound is introduced into a deposition chamber together with hydrogen at a volume ratio of the carbon compound gas/hydrogen=0.4 to 2.0. The deposition takes place in a magnetic field when microwaves energy is inputted to the reactive gas at no lower than 2 KW. The pressure of the reactive gas is kept between 0.01 to 3 Torr during the deposition. The substrate temperature is kept between 200° to 1000° C. The most effective flow speed of the reactive gas passing through the deposition space is 30 to 600 cm/sec preferably 35 to 200 cm/sec. By this method, diamond films consisting of $sp^3$ bonds can be deposited within 5% disparity in thickness at no lower than 0.5 micrometer/hour, typically at no lower than 1 micrometer/hour. Another application is an etching process which is carried out in the apparatus at 0.01 to 10 Torr in the same manner as deposition process except that an etchant gas is used in place of reaction gas for deposition. By the etching process in a high density plasma produced in the apparatus in accordance with the present invention, the etching speed is increased 5 times as higher than those attained by prior art apparatuses. The etching is sharply anisotropic so that patterning in submicron orders becomes possible.

BRIEF DESCRIPTION OF THE DRAWINGS

The accompanying drawings, which are incorporated in and form a part of the invention and, together with the description, serve to explain the principles of the invention.

DETAILED DESCRIPTION OF THE PREFERRED EMBODIMENTS

Figure 2:
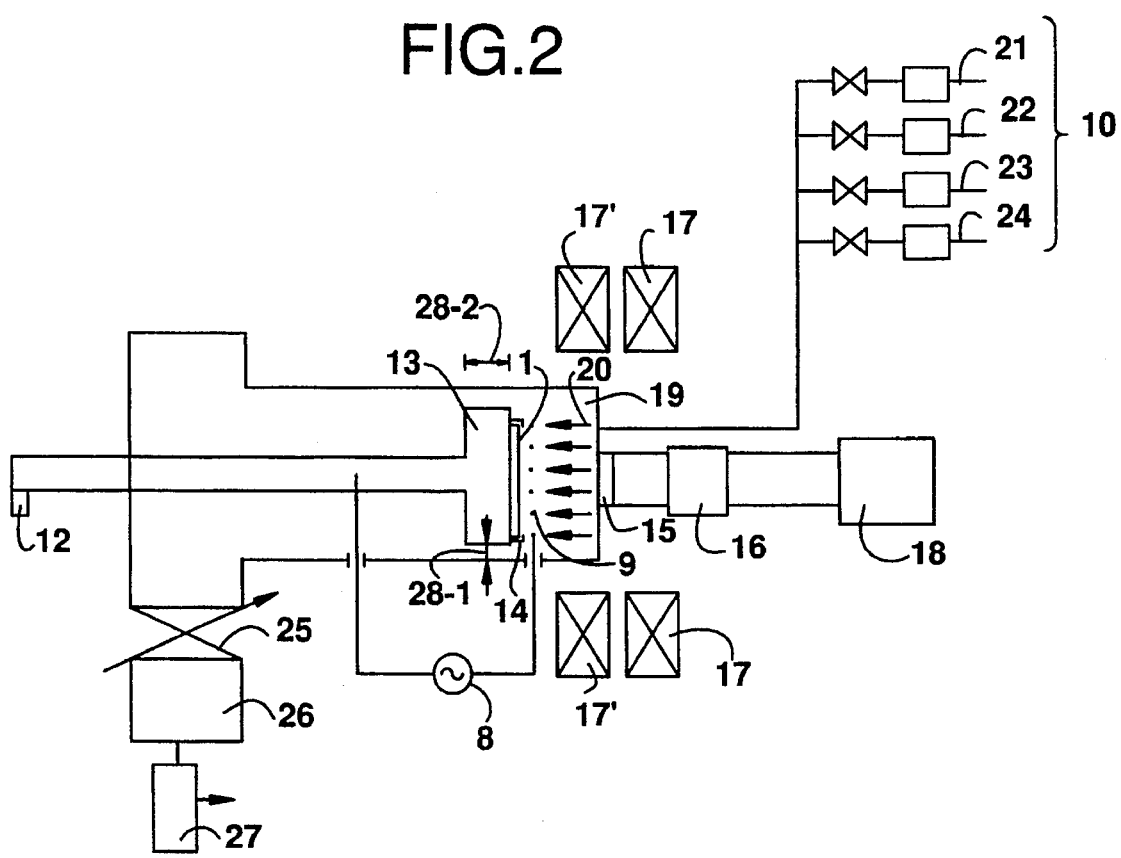
FIG. 2 is a cross sectional view of a microwave processing apparatus constructed in accordance with the present invention.

Referring now to FIG. 2, a plasma processing apparatus provided with associated Helmholtz coils 17 and 17' in accordance with the present invention is shown. The apparatus comprises a cylindrical vacuum chamber defining a reaction (deposition) space 19 therein, a microwave generator 18 connected to the chamber through an attenuater 16 and a quartz window 15, a high frequency AC voltage source 8, a gas introduction system 10 having four inlet ports 21 to 24, a gas evacuation system having a wide-range turbo molecular pump 26 and a rotary pump 27 for roughing coupled with the chamber through a pressure controlling valve 25 and a cylindrical substrate holder 13 provided coaxially in the chamber and with a substrate position adjusting mechanism 12 for supporting a substrate 1 at an appropriate position. By the use of the adjusting mechanism 12, the axial position of the holder can be adjusted in order to change the volume of the reactive space 19. The evacuation system funtions both as a pressure controller and as a stop valve. The pressure in the chamber is adjusted by means of the valve 25. The inside of the chamber and the holder 13 are aligned coaxial with each other. The diameter of the cylindrical inside of the chamber is 170 mm. The diameter of the cylindrical holder 13 is chosen to be 140 mm so that the clearance 28-1 between the chamber and the holder 13 is about 15 mm. The thickness 28-2 of the holder 13 is 10 to 50 mm. The clearance may be determined between 3 and 30 mm corresponding to 12.25 cm wavelength of input microwaves (narrower than ¼ of the wavelength). By this configuration, the reaction space 19 is confined in order not to substantially lose input energy and the reflection of microwaves inputted is only about 5%.

Next, a method of depositing diamond films by means of the apparatus in accordance with the invention as illustrated in FIG. 2 will be described. Namely, the diameter of the holder 13 is 140 mm against the 170 mm inner diameter of the reaction chamber; and therefore the gap therebetween is 15 mm. The substrate 1 is for example a single crystalline silicon semiconductor wafer of 4 inches diameter. After mounting the substrate 1 on the holder 13 with a keeper 14, the pressure in the reaction space 19 is reduced to $10^{-4}$ to $10^{-17}$ Torr by means of the evacuation system followed by introduction of a reactive gas into the chamber to a pressure of 0.03 to 3 Torr, typically 0.1 to 1 Torr, e.g. 0.26 Torr. The reactive gas comprises an alcohol such as methyl alcohol ($CH_3OH$) or ethyl alcohol ($C_2H_5OH$) diluted with hydrogen at a volume ratio of alcohol/hydrogen=0.4 to 2. The hydrogen is introduced through the port 21 at 100 SCCM and the alcohol through the port 22 at 70 SCCM for example. The coils are energized during the deposition to induce a magnetic field having a maximum strength of 2.2K Gauss and a resonating strength of 875 Gauss at the surface (or its vicinity) of the substrate 1 to be coated. Then, microwaves are applied up to 10 KW (2~10 KW) at 1 to 5 GHz, e.g. 2.45 GHz in the direction parallel to the direction of the magnetic field to cause ionized particles of the reactive gas in the form of a plasma to resonate therewith under the magnetic field. As a result, a polycrystalline film of diamond grows on the substrate. 2 hour deposition for example can form a diamond film of 0.5 to 5 micrometer thickness, e.g. 1.3 micrometers thickness. This deposition speed is 10 to 30 times as higher as conventional speeds of prior art ECR deposition. During the deposition of diamond film, carbon graphite is also deposited. However, the graphite, which is relatively chemically unstable as compared with diamond, reacts with radicals which also occur in the plasma of the alcohol and is removed from the deposited film in the form of $CO_2$ or $CH_4$. The temperature of the substrate 1 is elevated to 200° C. to 1000° C., typically 300° C. to 900° C., e.g. 800° C. by microwaves. If the substrate temperature is too elevated, water cooling is effected to the substrate holder 13. Inversely, if the substrate temperature is too low to effectively carry out the deposition, the holder is heated by means of an auxiliary heater (not shown). The flow speed of the reactive gas 20 in the reaction space 19 is regulated by controlling the valve 25 and the introduction rate of the reactive gas. From the view point of the deposition performance, speeds of 5 to 600 cm/sec typically 20 to 200 cm/sec are appropriate, e.g. 60 cm/sec at 0.1 Torr. The flow speed can be calculated by dividing the total gas volume supplied per second from the introduction system at the pressure in the chamber by the cross sectional inner area of the reaction space 19.

Figure 3:
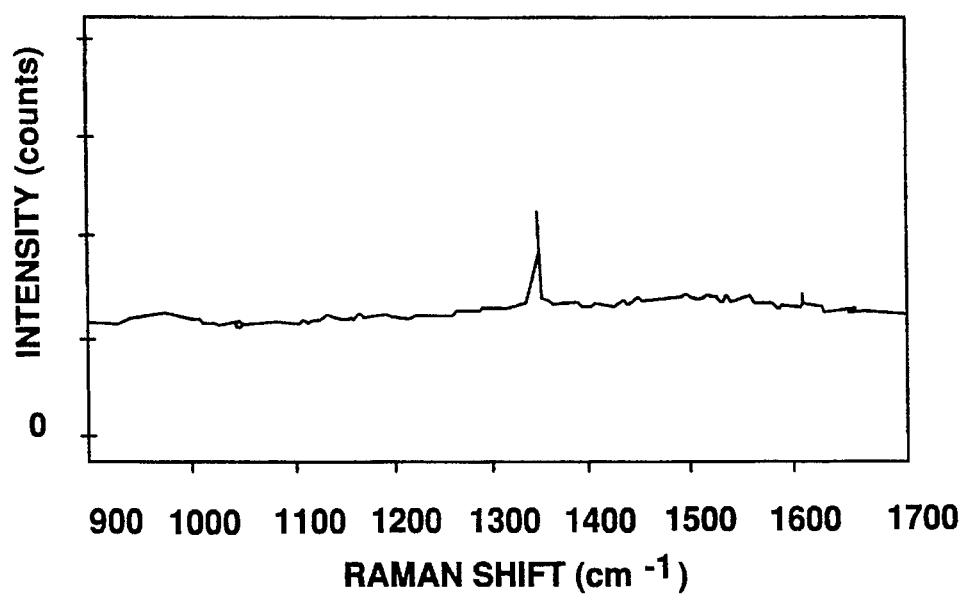
FIG. 3 is a graphic diagram showing a result of Raman spectroscopic analysis of a diamond film deposited by the use of the apparatus shown in FIG. 2 in accordance with the present invention.

In accordance with experiments, crystalline surfaces of single carbon crystals (diamond particles) were clearly observed in the films deposited by the above described method. FIG. 3 is a diagram showing Raman spectroscopic analysis of a diamond film deposited in accordance with the present invention. The sharp peak appearing at 1336 $cm^{-1}$ indicates existence of diamond. There is hardly found a peak at 1490 $cm^{-1}$ indicative of existence of graphite.

The apparatus illustrated in FIG. 2 can be used also to carry out etching process. A method of producing patterns on a silicon wafer of 4 inches diameter by etching will be described hereinbelow for example. Etchant gas sources are connected to the gas introduction system 10, e.g. $N_2$ (port 21), $SF_6$ (port 22), $CBrF_3$ (port 23) and $CBr_4$ (port 24). The procedure of the etching process is substantially same as the deposition process except that the reaction gas, i.e. etchant gas is used in place of deposition gas.

After mounting on the holder 13 a silicon semiconductor wafer provided with a photoresist mask having a pattern of 0.3 micrometer pitch, $SF_6$ and $CBrF_3$ were introduced to the reaction space 19 respectively at 40 cc/min. The pressure of the etchant gas was kept at 0.05 Torr in the chamber. A 13.56 KHz AC voltage was applied between the substrate holder 13 and a grid electrode 9 positioned parallel to the holder in the reaction space 19 by means of the AC voltage source 8. Alternatively, DC application may be used in place of the AC application. Then, microwaves at 2.45 GHz was inputted to the reaction space 19 from the generator 18 at 1 to 8 KW. As a result, etching action was carried out upon the substrate 1. The temperature of the substrate holder 13 was maintained no higher than 0° C. in order to cool the substrate 1 during etching. A DC self bias of −100 to −200 V was applied to the substrate 1. The etching speed was 0.9 micrometer/minute. The anisotropy index defined by (the horizontal distance between upper and lower ends of etched side surface)/(etching speed) was no higher than 0.05. In accordance with experiments, sharp depressions for trench structure were formed by etching within silicon wafers. When the pressure was elevated during etching to 0.1 Torr, 1 Torr and 5 Torr, the deposition speed also increased respectively to 2 micrometer/minute, 10 micrometer/minute and 23 micrometer/minute. In spite of such high deposition speeds, the anisotropy index were not so bad such as 0.1, 0.2 and 0.4 respectively. There was little difference between center and peripheral positions of the wafer in sharpness of etching effect (in terms of etching speed and anisotropy index). For example, when the etched surface condition at the center of the wafer was compared with the etched surface condition at 5 mm distant from the edge of the wafer, no appliciable difference was confirmed.

Figure 1:
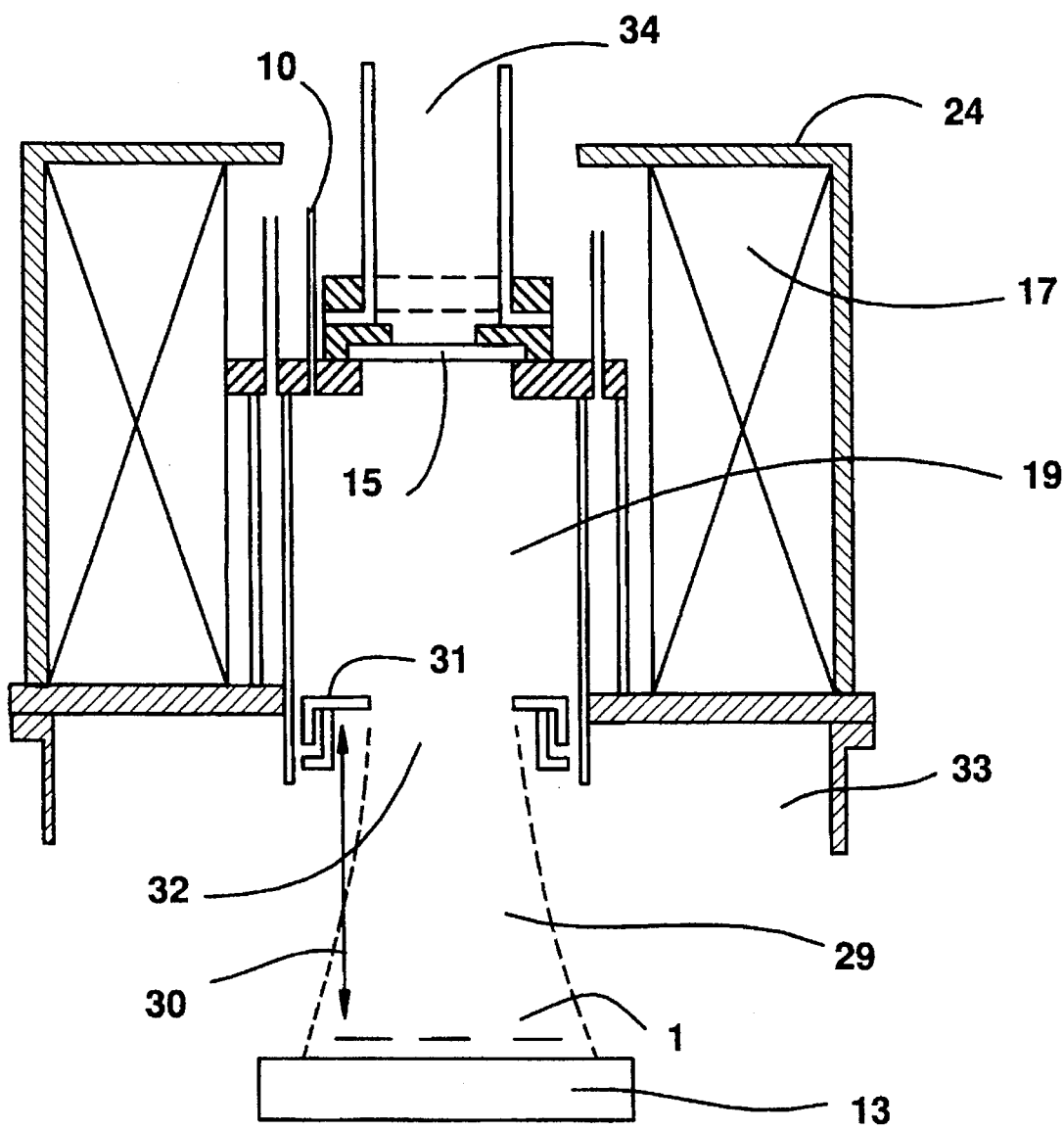
FIG. 1 is a cross sectional view showing a prior art microwave processing apparatus.

Expemiments were repeated in the same manner as explained above except for the diameter of the substrate holder 13. The substrate holders having diameters of 120 mm, 100 mm and 80 mm were used for the respective experiments in turns. The clearance was increased by the switch accordingly as 25 mm, 35 mm and 45 mm. The adjustment of the attenuator 16, however, became very difficult and effective introduction of microwaves could not be continued when the clearance exceeded ¼ of the wavelength (30.6 mm). It seemed that entirely different process condition needed for such a configuration as described in FIG. 1.

Figure 4:
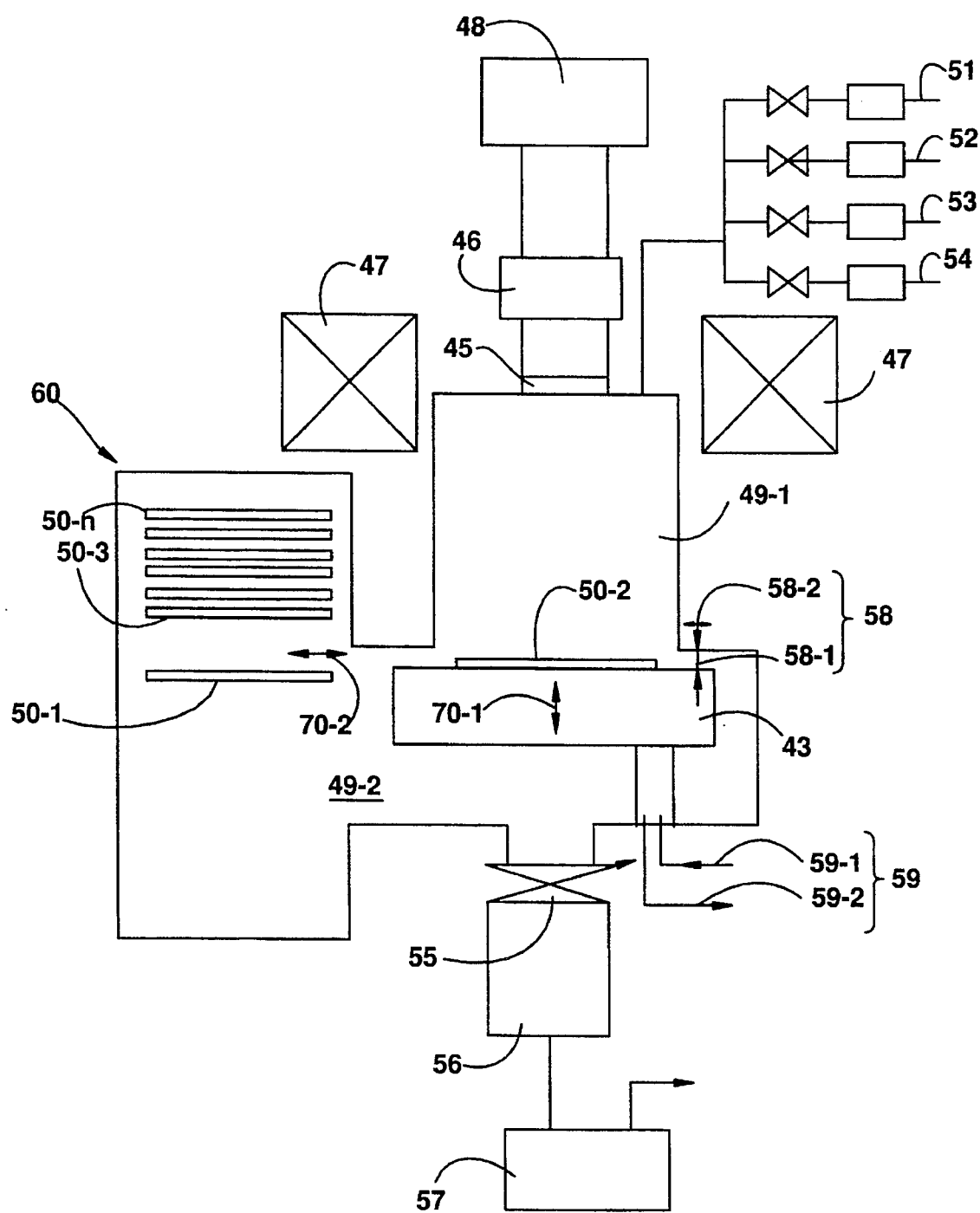
FIG. 4 is a cross sectional view showing a plasma processing apparatus in accordance with a second embodiment of the present invention.

Referring now to FIG. 4, a plasma processing apparatus in accordance with a second embodiment of the present invention is shown. The apparatus comprises a cylindrical reaction chamber 49-1 defining a reaction (deposition) space therein and associated with an auxiliary chamber 49-2, a microwave generator 48 connected to the reaction chamber 49-1 through an attenuater 46 and a quartz window 45, a gas introduction system 40 having four inlet ports 51 to 54, a gas evacuation system having a wide-range turbo molecular pump 56 and a rotary pump 57 for roughing coupled with the chamber through a pressure controlling valve 55 and a cylindrical substrate holder 43 located coaxially with the cylindrical chamber 49-1 and provided with a substrate position adjusting mechanism (not shown) for supporting a substrate 50-2 at an appropriate position. The evacuation system funtions both as a pressure controller and as a stop valve. The pressure in the chamber is adjusted by means of the valve 55. The cylindrical chamber 49-1 and the holder 43 are aligned coaxial with each other. The diameter of the cylindrical inside of the chamber defining the reaction space is 170 mm. The diameter of the cylindrical holder 43 is chosen to be 250 mm. The clearance 58-1 between the lower end of the cylindrical chamber 49-1 and the holder 43 is about 15 min. The thickness of the holder 43 is 10 to 50 min. The clearance may be determined between 3 and 30 mm corresponding to 12.25 cm wavelength of input microwaves (narrower than ¼ of the wavelength). The chamber is associated with substrate supply mechanism 60 formed in an extention of the auxiliary chamber. The extention communicates with the chamber and is projecting just aside from the position of the substrate holder 43. A number of substrates are held in parallel in the mechanism 60 as shown in the figure in order to move in the direction normal to the substrates. On the other hand, the substrate holder 43 is moved vertically (as shown by 70-1) in order to form a sufficient space between the end of the cylindrical chamber 49-1 and the holder 43 for transportation of a substrate from the mechanism 60 to the holder 43 (as shown by arrow 70-2).

Next, a method of depositing diamond films by means of the apparatus in accordance with the invention as illustrated in FIG. 4 will be described. Namely, the diameter of the holder 43 is 250 mm against the 170 mm inner diameter of the cylindrical chamber 49-1 defining the deposition space; and the gap therebetween is 15 mm. The substrate 50-2 is for example a single crystalline silicon semiconductor wafer of 6 inches diameter. After mounting the substrate 50-2 on the holder 43 by means of the substrate supply mechanism 60, the pressure in the reaction space is reduced to $10^{-4}$ to $10^{-7}$ Torr by means of the evacuation system followed by introduction of a reactive gas into the chamber to a pressure of 0.03 to 3 Torr, typically 0.1 to 1 Torr, e.g. 0.26 Torr. The reactive gas comprises an alcohol such as methyl alcohol ($CH_3OH$) or ethyl alcohol ($C_2H_5OH$) diluted with hydrogen at a volume ratio of alcohol/hydrogen=0.4 to 2. The hydrogen is introduced through the port 51 at 100 SCCM and the alcohol through the port 52 at 70 SCCM for example. The coils are energized during the deposition to induce a magnetic field having a maximun strength of 2.2 K Gauss and a resonating strength of 875 Gauss at the surface (or its vivinity) of the substrate 50-2 to be coated. Then, microwaves are applied up to 10 KW (2~10 KW) at 1 to 5 GHz, e.g. 2.45 GHz in the direction parallel to the direction of the magnetic field to cause ionized particles of the reactive gas in the form of a plasma to resonate therewith under the magnetic field. As a result, a polycrystalline film of diamond grows on the substrate. 2 hour deposition for example can form a diamond film at a deposition speed 10 to 30 times as higher as conventional speeds of prior art ECR deposition. During the deposition of diamond film, carbon graphite is also deposited. However, the graphite is removed from the deposited film in the form of $CO_2$ or $CH_4$ in the same manner as in the previous embodiment. The temperature of the substrate 1 is elevated to 200° C. to 1000° C., typically 300° C. to 900° C., e.g. 800° C. by microwaves. If the substrate temperature is too elevated, water cooling is effected to the substrate holder 43 by means of a water circulation system 59. Inversely, if the substrate temperature is too low to effectively carry out the deposition, the holder is heated by means of an auxiliary heater (not shown). The flow speed of the reactive gas in the reaction space is regulated by controlling the valve 55 and the introduction rate of the reactive gas. From the view point of the deposition performance, speeds of 5 to 600 cm/sec typically 20 to 200 cm/sec are appropriate, e.g. 60 cm/sec at 0.1 Torr. In accordance with experiments, crystalline surfaces of single carbon crystals were also clearly observed in the films deposited also in this apparatus.

The deposition procedure was repeated anew by replacing the substrate already coated with a new substrate transported from the supply mechanism. The replacement was carried out as following manner. When the deposition was completed on a substrate mounted on the holder 43, the holder 43 was moved downward and the substrate was sent back to the supply mechanism 60. The arrangement of substrates 20-1 to 20-n was then moved downward by a distance corresponding to the distance between adjacent substrates. In this position, the substrate holder 43 was supplied with another substrate which was positioned just above the previously coated substrate in the mechanism 60.

After the deposition process, the inside of the reaction and auxiliary chambers has to be cleaned by etching with the holder being kept in its deposition position or lowered position. The procedure of etching is substantially same as explained in the following description with reference to FIG. 5 which is directed to patterning rather than cleaning.

Figure 5:
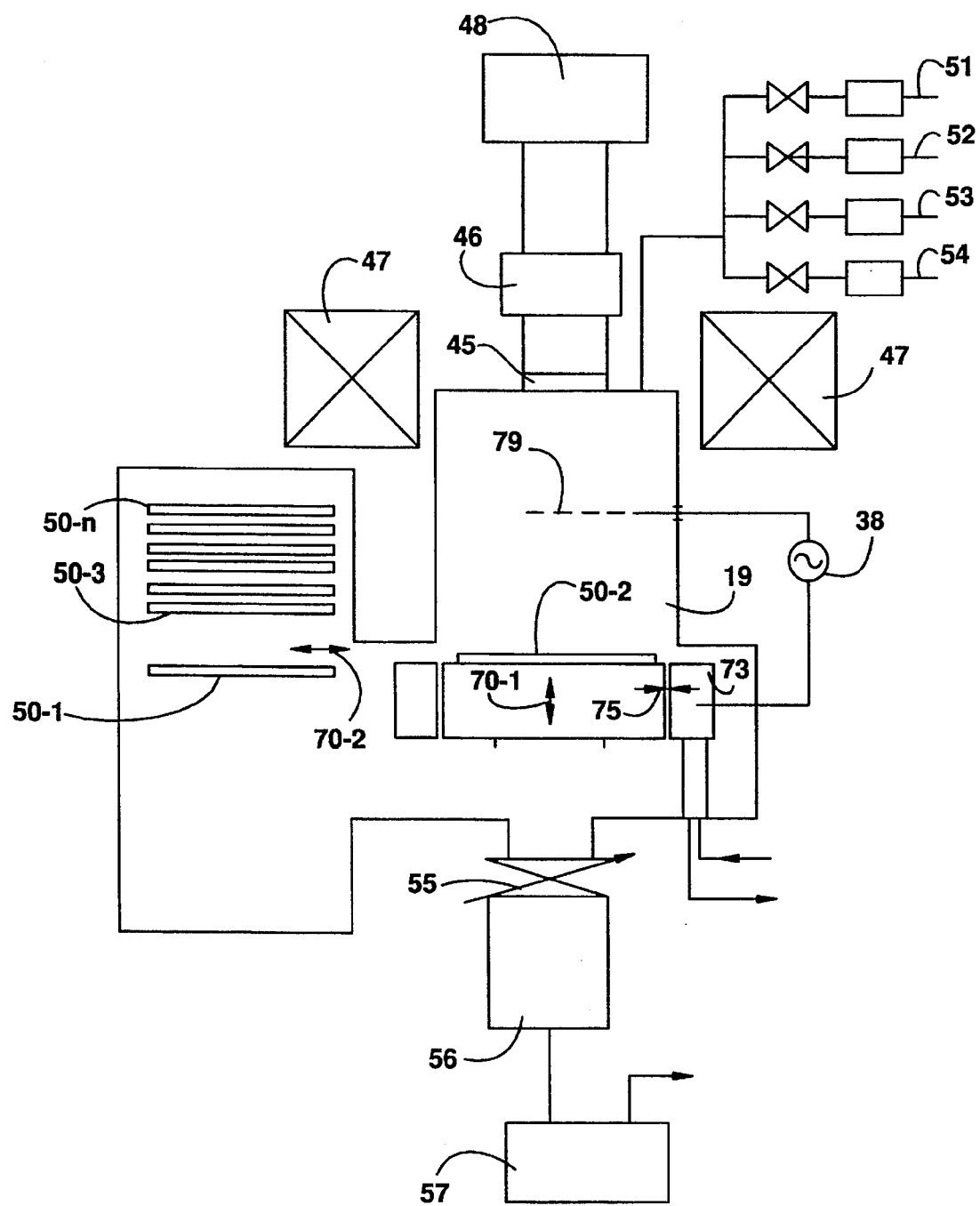
FIG. 5 is a cross sectional views showing a plasma processing apparatus in accordance with a third embodiment of the present invention.

FIG. 5 is a cross sectional view in accordance with a third embodiment of the present invention. This embodiment is substantially same as the second embodiment illustrated in FIG. 4 except those particularly described in this paragraph. The substrate holder 73 of this embodiment is formed with circular through holes 75 of 5 to 30 mm diameter, e.g. 10 mm diameter. The diameter of the holes 75 also has to be no more than ¼ of the wavelength of input microwaves. The thickness of the holder 75 is 10 to 40 mm. The number of the holes 75 is 4 to 16 and distributed around the substrate 50-2. A high frequency AC voltage source 38 is connected between the substrate holder 73 and a grid electrode 79 which is located against the substrate in the reaction space.

Next, a method of producing patterns on a silicon wafer of 4 inches diameter by etching will be described hereinbelow. Etchant gas sources are connected to the gas introduction system, e.g. $N_2$ (port 51), $SF_6$ (port 52), $CBrF_3$ (port 53) and $CBr_4$ (port 54). The etching process is substantially same as the deposition process as described in conjunction with FIG. 4 except the reaction gas, i.e. etchant gas in place of deposition gas. When submicron patterns are produced, a bias voltage is applied to the wafer to induce an additional electric field normal thereto and the pressure in the reaction chamber is relatively elevated.

After mounting on the holder 43 a silicon semiconductor wafer provided with a photoresist mask having a pattern of 0.3 micrometer pitch, $SF_6$ and $CBrF_3$ were introduced to the reaction space respectively at 40 cc/min. The pressure of the etchant gas was kept at 0.05 Torr in the chamber. A 13.56 KHz AC voltage was applied between the substrate holder 13 and a grid electrode 79 positioned parallel to the holder in the reaction space by means of the AC voltage source 38. Alternatively, DC application may be used in place of the AC application. Then, microwaves at 2.45 GHz was inputted to the reaction chamber 19 from the generator 48 at 1 to 8 KW. As a result, etching action was carried out upon the substrate 50-2. The temperature of the substrate holder 43 was maintained no higher than 0° C. in order to cool the substrate 1 during etching. A DC self bias of −100 to −200 V was applied to the substrate 50-2. As a result, fine patterns were produced with same qualities as obtained by the apparatus illustrated in FIG. 2 and explained above. When a substrate holder formed with openings of 40 mm diameter was disposed in place of the holder 43 for reference, the sharpness of patterns at peripheral positions of a wafer was substantially degraded.

Anyway, in accordance with the present invention, plasma carrying input energy does not appear when a reactive gas come out from the reaction space through a narrow clearace between the substrate holder and the chamber. This is particularly advantageous to the structure as illustrated in FIGS. 4 or 5 in which a number of substrates are kept within the chamber. The substrates otherwise should be influenced by a plasma to some extent.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated. Although in the above examples the reaction space is formed cylindrical, it can be of any other geometry as long as the substrate holder is shaped congruent with the geometry and the differential size therebetween is determined with reference to ¼ of the wavelength. For example, the cross section of the space may be a polygon. The methods of deposition and etching disclosed herein are also only examples. The apparatus can be used for deposition of any suitable materials other than diamond, e.g. BN, BP, $Si_3N_4$ etc. High speed etching can be effected with an etchant of high density CBr alone to produce patterns on superconducting films, metallic films, semiconductor films, insulating films and so forth.

What is claimed is:

1. A plasma processing method comprising the steps of:
   preparing a substrate holder in a reaction chamber so that a reaction space is defined in the chamber by inside walls of the chamber and a side of the substrate holder carrying a substrate;
   inputting a reactive gas into said reaction space;
   converting said reactive gas into plasma by supplying an electromagnetic energy to said reactive gas;
   evacuating said reaction space during the plasma processing through a gap between the substrate holder and the inside wall of the chamber, wherein said gap is not larger than ¼ of a wavelength of the inputted electromagnetic energy; and
   treating a surface of the substrate located on said substrate holder with said plasma;
   wherein said plasma is confined in said reaction space, whereby reactive gas in a part of the reaction chamber outside said reaction space has non-plasma form.

2. The plasma processing method of claim 1 further comprising the step of exhausting a gas which is not used in plasma processing from said reaction space during the plasma processing.

3. The plasma processing method of claim 1 wherein said plasma processing is a chemical vapor deposition.

4. The plasma processing method of claim 1 wherein said plasma processing is an etching.

5. A plasma processing method comprising the steps of:
   preparing a substrate holder in a reaction chamber;
   inputting a reactive gas into a reaction space of said chamber, said reaction space being defined by at least an inside wall of said reaction chamber and a side of said substrate holder carrying a substrate;
   converting said reaction gas into plasma by supplying an electromagnetic energy to said reactive gas;
   performing a plasma process on the substrate in said reaction space; and
   evacuating said reaction space during the plasma processing through a gap between the substrate holder and the inside wall of the chamber,
   wherein said plasma reverts to a non-plasma gas form when passing through said gap and said gap is not larger than ¼ of a wavelength of the inputted electromagnetic energy.

6. The plasma processing method of claim 5 wherein said plasma processing is a chemical vapor deposition.

7. The plasma processing method of claim 5 wherein said plasma processing is an etching.

8. A plasma processing method comprising the steps of:
   preparing a substrate holder in a reaction chamber so that a reaction space is defined by at least an inside wall of said chamber and a side of said substrate holder carrying a substrate;
   introducing a reactive gas into the reaction space;
   inducing a magnetic field in said space;
   inputting a microwave into said reaction space to convert said reactive gas to a plasma form; and exhausting said gas from said chamber through a gap between said holder and said inside wall of the chamber, wherein said plasma is confined in said reaction space as the gas is exhausted, whereby reactive gas in a part of the reaction chamber outside said reaction space has non-plasma form and said gap is not larger than ¼ of a wavelength of the inputted electromagnetic energy.

9. A plasma processing method comprising the steps of:

preparing a substrate holder in a reaction chamber so that a reaction space is defined by at least an inside wall of said chamber and a side of said substrate holder carrying a substrate;

introducing a reactive gas into the reaction space;

inducing a magnetic field in said space;

inputting a microwave into said reaction space to convert said reactive gas to a plasma form; and exhausting a gas from said chamber through a gap between said holder and said inside wall of the chamber, wherein said plasma reverts to a non-plasma gas form when passing through said gap and said gap is not larger than ¼ of a wavelength of the inputted microwave.

10. A plasma processing method comprising the steps of:

preparing a substrate holder in a reaction chamber so that a reaction space is defined by at least an inside wall of said chamber and said substrate holder;

introducing a reactive gas into the reaction space;

inducing a magnetic field in said space;

inputting a microwave into said reaction space; and exhausting a gas from said chamber through a gap between said holder and said inside wall of the chamber, wherein said gap is not larger than ¼ of the wavelength of the inputted microwave.

* * * * *